(12) United States Patent
Shokouhi et al.

(10) Patent No.: US 6,249,458 B1
(45) Date of Patent: Jun. 19, 2001

(54) SWITCHING CIRCUIT FOR TRANSFERENCE OF MULTIPLE NEGATIVE VOLTAGES

(75) Inventors: Farshid Shokouhi, San Jose; Michael G. Ahrens, Sunnyvale; Ben Y. Sheen, Milpitas, all of CA (US)

(73) Assignee: Xilinx, Inc., San Jose, CA (US)

( * ) Notice: Subject to any disclaimer, the term of this patent is extended or adjusted under 35 U.S.C. 154(b) by 13 days.

(21) Appl. No.: 09/603,462

(22) Filed: Jun. 22, 2000

(51) Int. Cl.[7] ................................... G11C 16/00
(52) U.S. Cl. ................. 365/185.23; 365/189.11; 326/80
(58) Field of Search ............. 365/185.23, 185.05, 365/189.09, 189.11; 326/80, 81

(56) References Cited

U.S. PATENT DOCUMENTS

| | | | |
|---|---|---|---|
| 4,694,430 | * 9/1987 | Roher | 365/185.23 |
| 5,428,568 | * 6/1995 | Kobayashi et al. | 365/185.23 |
| 6,049,498 | * 4/2000 | Chen | 365/185.23 |

* cited by examiner

Primary Examiner—Tan T. Nguyen
(74) Attorney, Agent, or Firm—Bever, Hoffman & Harms, LLP; Patrick T. Bever; Lois D. Cartier

(57) ABSTRACT

A floating gate memory device that includes a switching circuit for selectively transferring two or more negative voltages to a common node (e.g., to the negative pole of a driver circuit). The switching circuit includes two switches respectively connected between the two negative voltages and the common node. Each of the switches includes series-connected triple-well NMOS transistors that provide a dual-isolation structure between the common node the negative voltage sources. An optional triple P-well resistor is provided between the series-connected triple-well NMOS transistors in each of the switches that includes a deep N-well region biased by a system voltage source (e.g., VCC) to reverse bias the central P-well region.

16 Claims, 7 Drawing Sheets

US 6,249,458 B1

SWITCHING CIRCUIT FOR TRANSFERENCE OF MULTIPLE NEGATIVE VOLTAGES

FIELD OF THE INVENTION

The present invention relates to electrically erasable programmable floating gate memory devices and, more particularly, the present invention relates to a switching circuitry for controlling the various voltages utilized to program/erase such floating gate memory devices.

DISCUSSION OF RELATED ART

Electrically erasable programmable floating gate memory devices, such as flash memory devices, typically include an array of floating gate memory cells and associated control circuitry. Each floating gate memory cell includes a floating gate structure (e.g., polysilicon) that is surrounded by an insulation material (e.g., silicon dioxide) and located over a channel extending between a source and drain region formed in a substrate. A control gate is typically located on the insulation material over the floating gate structure. Current between the source and drain is controlled by the programmed/erased state of the floating gate structure. This programmed/erased state is determined by the number of electrons stored (captured) in the floating gate structure. The floating gate structure is erased (i.e., injected with electrons until the floating gate structure stores a net negative charge) by applying a first set of voltages to the source, drain, and control gate. This net negative charge resists source-to-drain currents during read operations. Conversely, the floating gate structure is programmed (i.e., electrons are discharged until the floating gate structure has a net positive charge) by a first set of voltages to the source, drain, and control gate. This net positive charge facilitates source-to-drain currents during read operations.

The program/erase operations of floating gate memory devices require relatively high voltage differentials (i.e., relative to read operations) to inject electrons into or discharge electrons from the floating gate structures. These programming voltages are applied to the source, drain and control gates of each floating gate structure in a predetermined pattern in order to perform the desired program or erase operation. Some floating gate memory devices utilize operation voltage schemes that include both positive (i.e., above ground) and negative (i.e., below ground) voltages to reduce the stress on chip elements. In these cases, relatively large voltage differentials are created by applying a positive voltage to one terminal of the memory cell and a negative voltage to another terminal, thereby creating large voltage potentials without requiring very large positive voltages. For example, a program operation may require a voltage equal to −8.0 V (Volts) to be applied to the control gate of a memory cell, while a read operation may require a voltage equal to −2.0 V to be applied to the control gate of the memory cell. For this reason, it necessary to provide multiple negative voltages (e.g., −8 V and −2 V) to a common node (e.g., the negative supply rail of a floating gate memory cell driver circuit).

FIG. 11 is a schematic diagram of a conventional switching circuit 1100 used to selectively provide multiple negative voltages to a common node (e.g., the negative supply rail of wordline driver 1110, which is used to apply voltages onto the control gate CG of a floating gate memory cell 1115). Transistor T1 has a source coupled to a first negative voltage $V_{N1}$ (e.g., −8 V), a control gate coupled to a first control voltage $V_{CG1}$ (e.g., either 0 V or 3 V), and a drain coupled to a common node. Transistor T2 has a source coupled to a second negative voltage $V_{N2}$ (e.g., −2 V), a control gate coupled to a first control voltage $V_{CG2}$ (e.g., either 0 V or 3 V), and a drain coupled to the common node. To selectively apply the first negative voltage $V_{N1}$ to the common node (e.g., to program floating gate memory cell 115), a positive voltage (e.g., 3.0 V) is applied to the control gate of transistor T1, and 0 V is applied to the control gate of transistor T2. A problem with this arrangement arises, however, because the voltage differential between the drain of transistor T2, which is coupled to the −8.0 V on the common node, and the −2.0 V applied to the source allows current to flow through transistor T2, thereby preventing the common node from reaching the full −8.0 V required to program floating gate memory cell 1115.

What is needed is a circuit that transfers multiple negative voltages (e.g., both −2 V and −8 V) to a common node that overcomes the leakage current deficiency of conventional switching circuit 1100.

SUMMARY OF THE INVENTION

The present invention provides an electrically erasable programmable floating gate memory device that addresses the problems discussed above.

In accordance with a first embodiment of the present invention, an electrically erasable programmable floating gate memory device includes a switching circuit for selectively transferring two or more negative voltages to a common node (e.g., to the negative supply rail of a driver circuit). The switching circuit includes a first switch connected between a first negative voltage supply and the common node, and a second switch connected between a second voltage supply and the common node. Each of the first and second switches includes series-connected triple-well NMOS transistors that provide a dual-isolation structure between the common node the negative voltage sources, thereby preventing the less-negative voltage source from pulling up the common node when a more-negative voltage is applied to the common node.

In accordance with another embodiment of the present invention, a triple P-well resistor is provided between the series-connected triple-well NMOS transistors in each of the first and second switches. Each triple P-well resistor includes a central P-well region formed in a deep N-well region that in turn is formed in a P-substrate (or outer P-well). The N-well region is biased by a system voltage source (e.g., Vcc) and the P-substrate is grounded, thereby reverse biasing the central P-well region to limit leakage current from the P-well region.

BRIEF DESCRIPTION OF THE DRAWINGS

The advantages, features and design of the invention will become apparent from the following detailed description of the invention and the accompanying drawings in which like reference numerals refer to like elements and in which.

DETAILED DESCRIPTION

Figure 1:
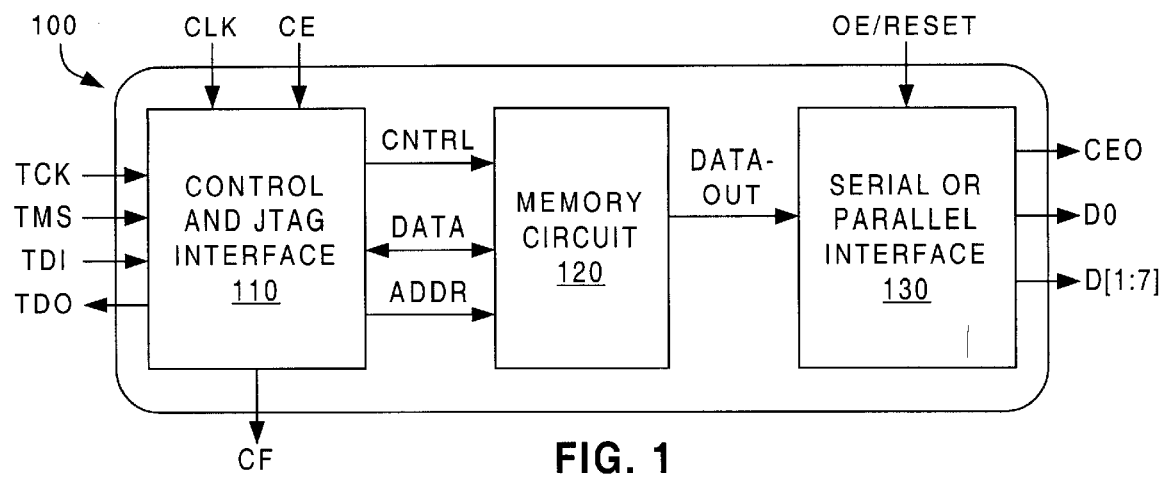
FIG. 1 is a simplified block diagram showing an In-System Programmable (ISP) floating gate memory device incorporating the present invention.

In accordance with the present invention, a novel In-System Programmable (ISP) floating gate memory device is provided that facilitates program/erase operations using various programming voltages. The various switching circuits and methods of the present invention provide ideal operating voltages that optimize the programmed and erased states of the floating gate memory cells contained therein. In the following description, while numerous specific details are included to provide a thorough description of the present invention, well-known features of integrated circuits have not been described in detail so as not to obscure the present invention unnecessarily. Further, while the present invention is described with specific reference to ISP floating gate memory devices, the various aspects of the present invention may be utilized in other floating gate memory devices, and in other circuit types requiring voltages similar to the program/erase voltages described below.

In the following description and in the drawings, transistors represented by a transistor symbol with a circle on the gate are PMOS transistors. Transistors represented by a transistor symbol without a circle on the gate are NMOS transistors. PMOS transistors are those with a P-type source/drain region in N-type substrate regions. NMOS transistors are those having an N-type source/drain region in P-type substrate regions.

FIG. 1 is a block diagram showing an In-System Programmable (ISP) floating gate memory device 100 that incorporates the present invention. ISP floating gate memory device 100 is consistent with memory devices of the XC18V00 family of In-System Programmable Configuration PROMs that are produced by Xilinx, Inc., of San Jose, Calif. A primary function of the XC18V00 family is to store configuration data for SRAM-based Programmable Logic Devices (PLDs) that are also produced by Xilinx, Inc.

Referring to FIG. 1, ISP floating gate device 100 generally includes a control/JTAG interface circuit 110, a memory circuit 120, and a serial/parallel interface 130. ISP floating gate device 100 receives in-system programming instructions and data using conventional JTAG signals. JTAG interface circuit 110 also receives an external clock signal CLK and daisy chain control signals CE and CF. JTAG interface circuit 110 generates operation control signals (CNTRL) and memory address (ADDR) signals that are transmitted to memory circuit 120 during program, read, and other operations to change or read the data (DATA) stored in memory circuit 120. When the data stored in memory circuit 120 is used to configure a PLD (not shown), the data is read from memory circuit 120 and transmitted through serial/parallel interface circuit 130 (along with other control signals) to the PLD.

Figure 2:
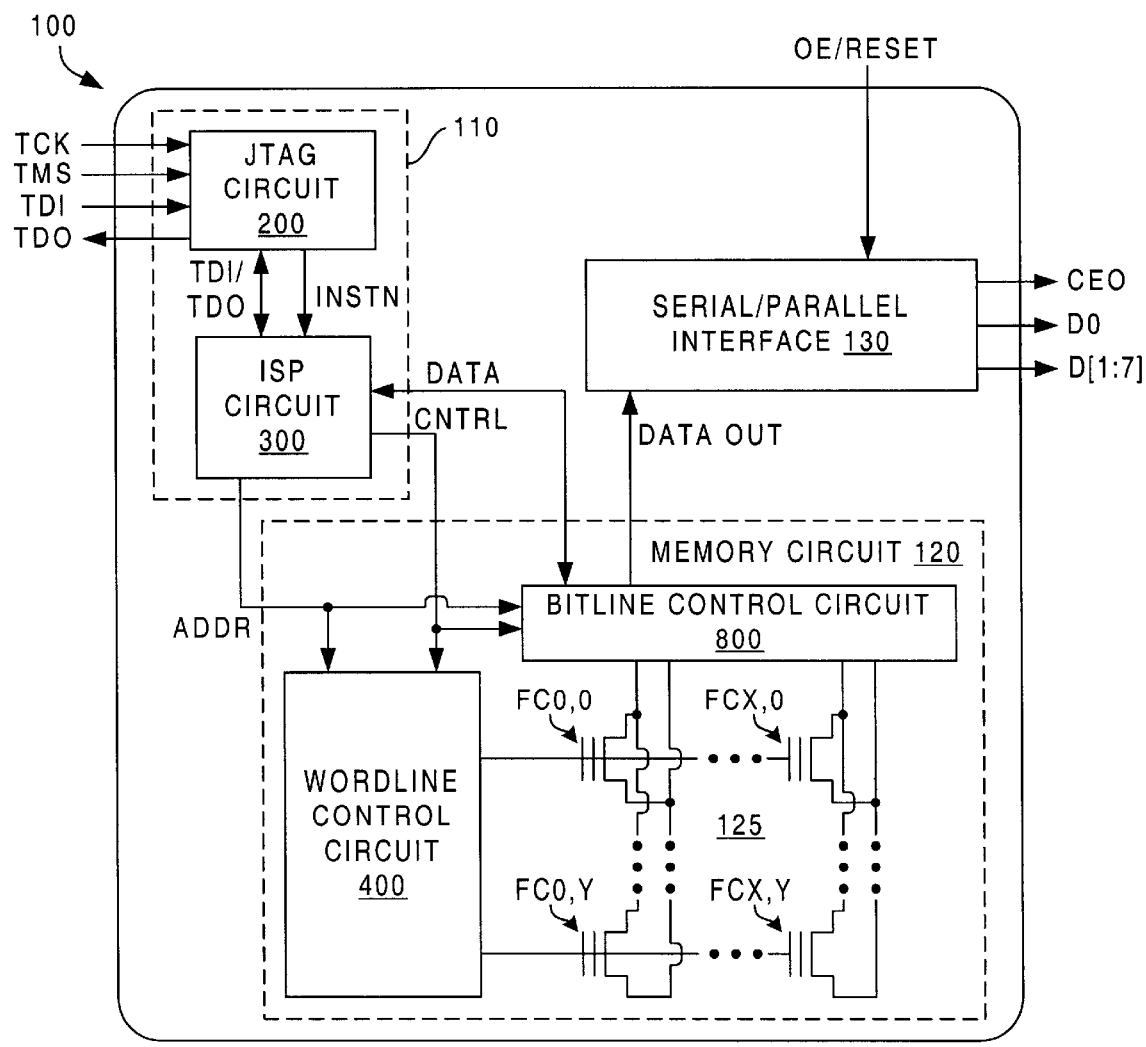
FIG. 2 is a block diagram showing the ISP floating gate memory device of FIG. 1 in additional detail.

FIG. 2 is an expanded block diagram showing ISP floating gate device 100 in additional detail. In particular, control and JTAG interface circuit 110 is separated into two components: a "standard" JTAG circuit 200 and an In-System Programming (ISP) circuit 300 that are discussed in additional detail in co-owned and co-pending U.S. patent application Ser. No. 09/603,464, entitled "IN-SYSTEM PROGRAMMABLE FLASH MEMORY DEVICE WITH TRIGGER CIRCUIT FOR GENERATING LIMITED DURATION PROGRAM INSTRUCTION", which is incorporated herein in its entirety. In addition, memory circuit 120 is separated into a wordline control circuit 400, a bitline control circuit 800, and an array 125 of floating gate memory cells FC0,0 through FCX,Y. ISP circuit 300 operates in response to various instruction (INSTN) signals provided by JTAG circuit 200 to generate address (ADDR) and control (CNTRL) signals that are transmitted to wordline control circuit 400 and bitline control circuit 800 of memory circuit 120. In response to these address and control signals, wordline control circuit 400 and bitline control circuit 800 apply appropriate voltages onto the wordlines and bitlines of array 125, thereby performing program, erase, and read operations on the data stored in memory cells FC0,0 through FCX,Y.

Figure 3:
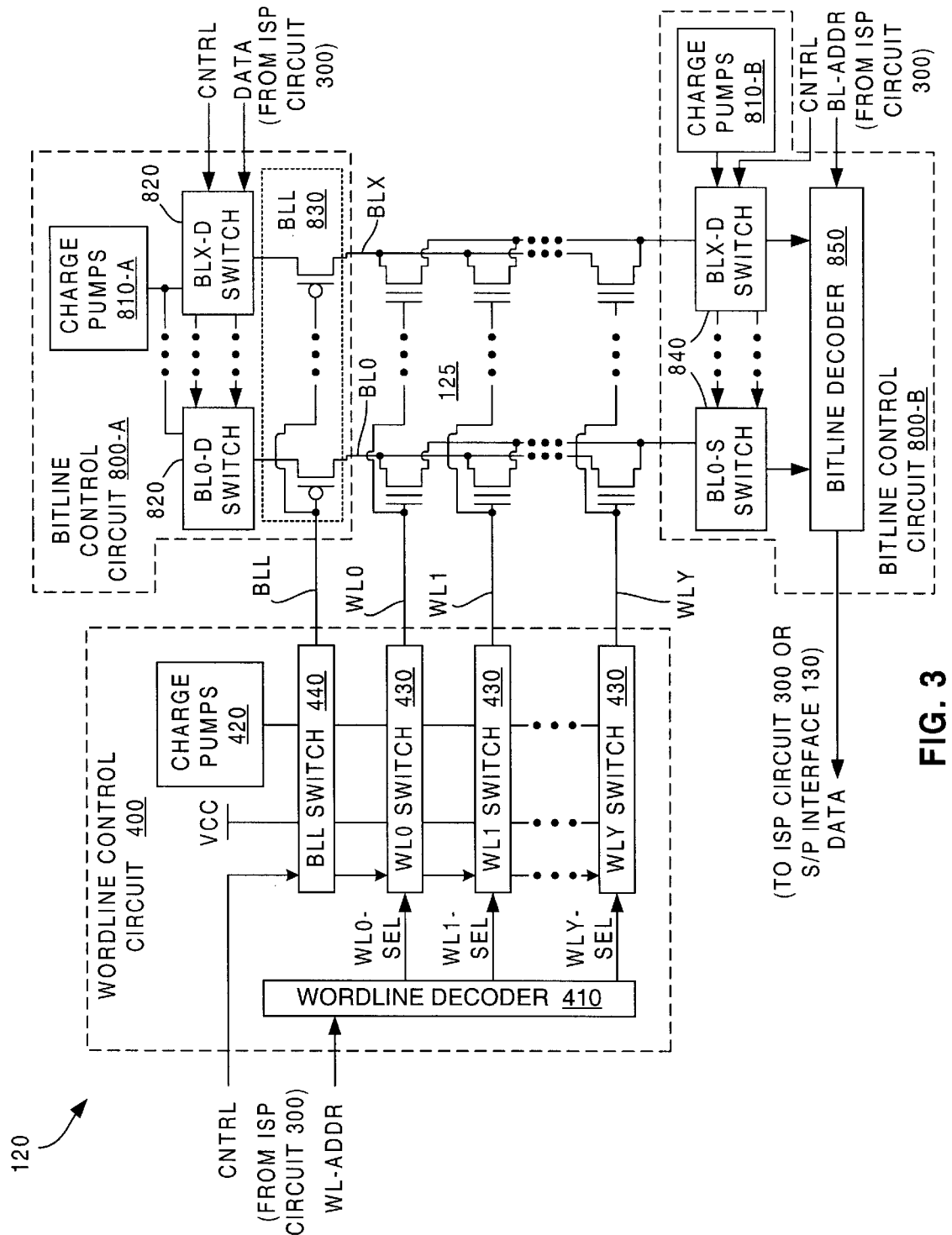
FIG. 3 is a block diagram showing a memory circuit of the ISP floating gate memory device of FIG. 2 in additional detail.

FIG. 3 is a block diagram showing the various components of memory circuit 120 in additional detail.

Referring to the left side of FIG. 3, wordline control circuit 400 includes a wordline decoder 410, a charge pump circuit 420, a series of wordline switches 430, and a bitline latch (BLL) control switch 440. Wordline decoder 410 receives a wordline address signal WL-ADDR from ISP circuit 300 (see FIG. 2), and asserts a wordline select signal WL[X]-SEL on a selected wordline in response to its associated unique wordline address signal according to known methods. The wordline select signals are applied to the wordline switches 430, which also receive the control signal CNTRL and one or more program/erase voltages generated by charge pump circuit 420. As discussed below, each wordline switch 430 generates appropriate voltage levels onto the wordlines WL0 through WLY of memory array 125 in accordance with a selected program/erase/read operation.

Referring to the right side of FIG. 3, bitline control circuit 800 is separated into two components: an upper section 800-A that receives operation control signals CNTRL and data from ISP circuit 300, and a lower section 800-B that receives operation control signals CNTRL and bitline address signals BL-ADDR from ISP circuit 300. Upper section 800-A includes charge pump circuit 810-A, a series of bitline drain switches 820, and a bitline latch (BLL) circuit 830. As discussed below, each bitline switch 830 generates appropriate voltage levels onto the bitlines BL0 through BLX of memory array 125 in accordance with a selected program/erase/read operation. Lower section 800-B includes charge pump circuit 810-B, a series of bitline source switches 840, and a bitline decoder 850. Bitline source switches 840 operate in a manner similar to bitline drain switches 830 (discussed below) to generates appropriate voltage levels onto the bitlines BL0 through BLX of memory array 125 in accordance with a selected program/erase/read operation. Bitline decoder 850 receives a bitline address signal BL-ADDR from ISP circuit 300 (see FIG. 2), and passes data from selected bitlines to ISP circuit 300 or to serial/parallel interface circuit 130 (see FIG. 2) in response to its associated unique bitline address signals according to known methods.

Although charge pump circuits 420, 810-A, and 810-B are depicted separately in FIG. 3 for descriptive purposes, one or more of the charge pumps utilized in memory circuit 120 may be combined.

Figure 4:
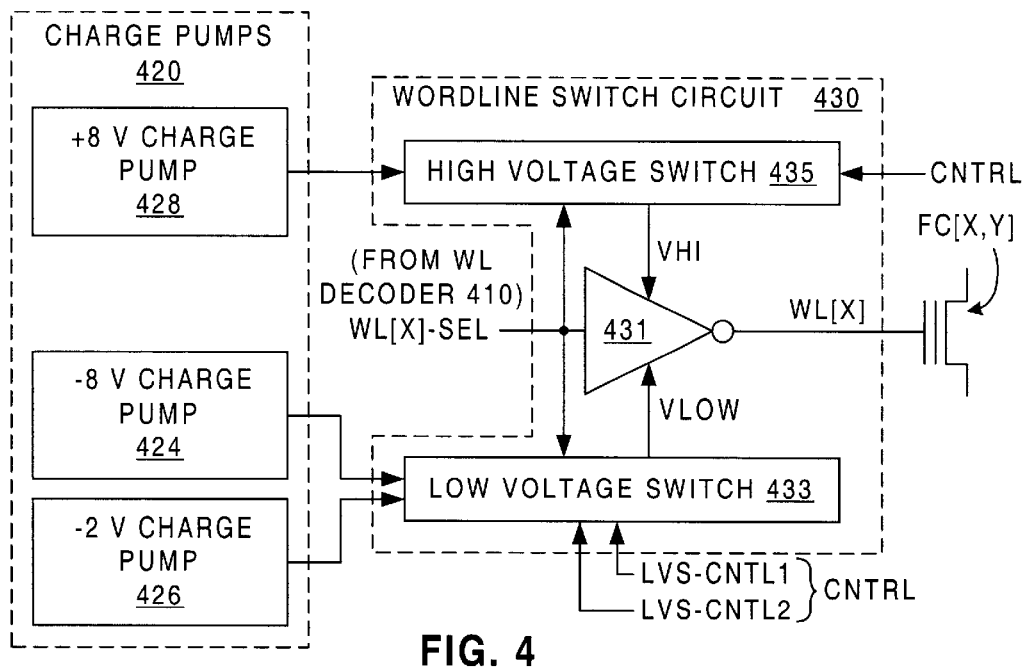
FIG. 4 is a block diagram showing a wordline switch circuit of the memory circuit of FIG. 3.

FIG. 4 is a block diagram showing a wordline switch circuit 430 in additional detail, along with associated charge pumps of charge pump circuit 420. Wordline switch circuit 430 includes a wordline driver 431 (shown as an inverter) that has an input terminal connected to wordline decoder 410 (see FIG. 3), a positive supply rail connected to receive a low voltage signal VLOW from a low voltage switch 433, and a positive supply rail connected to receive a high voltage signal VHI from a high voltage switch 435. Wordline driver 431 generates an output signal onto an associated wordline WL[X] having a logic value (i.e., either VHI or VHLO) that is determined by a wordline select signal WL[X]-SEL received from wordline decoder 410. The voltage levels VHI and VLOW supplied to wordline driver 431 are controlled by the low voltage switch 433 and high voltage switch 435, which in turn are controlled by operation control signals CNTRL. Specifically, as discussed in detail below, low voltage switch 433 receives voltages from a −8 V charge pump 424 and a −2 V charge pump 426, and is controlled by two control signals LVS-CNTL1 and LVS-CNTL2 to generate a VLOW voltage level of −8 V, −2 V, or 0 V, depending upon the particular operation being performed. Similarly, high voltage switch 435 is connected to a +8 V charge pump 428, and is controlled by specific control voltages to generate a VHI voltage level of +8 V, +5 V, 2.2 V, or 1.5 V, depending upon the particular operation being performed.

Figure 5:
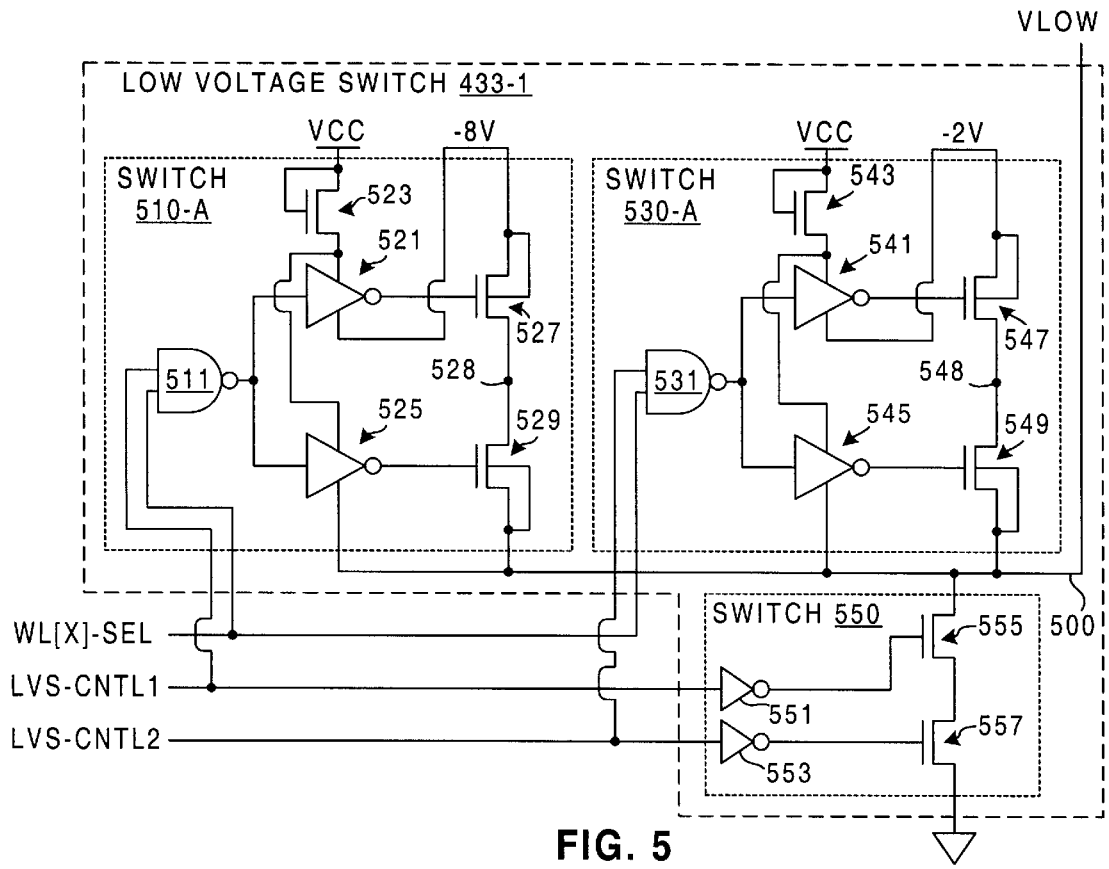
FIG. 5 is a schematic diagram showing a low voltage switch of the wordline switch circuit of FIG. 4 according to an embodiment of the present invention.

FIG. 5 is a schematic diagram showing a low voltage switch (switching circuit) 433-1 for transferring multiple negative voltages to a common node 500 in accordance with an embodiment of the present invention. Low voltage switch 433-1 represents a specific embodiment of low voltage switch 433 shown in FIG. 4. As mentioned above with reference to FIG. 4, low voltage switch 433-1 selectively connects either the −8 V source or the −2 V source to common node 500, which generates the low voltage signal VLOW that is supplied to the negative supply rail of wordline driver 431 (see FIG. 4). Low voltage switch 433-1 includes a first switch 510-A connected between the −8 V supply (i.e., charge pump 424; see FIG. 4) and common node 500, and a second switch 530-A connected between the −2 V supply (i.e., charge pump 426; see FIG. 4) and common node 500. According to the first embodiment, each of first switch 510-A and second switch 530-A includes a pair of series-connected triple-well NMOS transistors that provide a dual-isolation structure between common node 500, the −8 V source and −2 V source, respectively, thereby preventing the −2 V source from pulling up common node 500 when the −8 V source is passed by first switch 510-A to common node 500.

Referring to the left side of FIG. 5, first switch 510-A includes a logic NAND gate 511, a first inverter 521, an NMOS transistor 523, a second inverter 525, a first triple-well NMOS transistor 527, and a second triple-well NMOS transistor 529. The input terminals of logic NAND gate 511 are respectively connected to a wordline select signal WL[X]-SEL, which is received from wordline decoder 410 (see FIG. 3), and to first control signal LVS-CNTL1. The positive supply rail of first inverter 521 is maintained one threshold voltage below system voltage VCC by transistor 523, and the negative supply rail of first inverter 521 is connected to the −8 V source. The output terminal of first inverter 521 is connected to the gate terminal of first triple-well NMOS transistor 527, which has a source/body connected to the −8 V source. The positive supply rail of second inverter 525 is also maintained one threshold voltage below system voltage VCC, but the negative supply rail of second inverter 525 is connected to common node 500. The output terminal of second inverter 525 is connected to the gate terminal of second triple-well NMOS transistor 529, which has a drain/body connected to common node 500. Note that an intermediate node 528 is provided between the drain of first triple-well NMOS transistor 527 and the source of second triple-well NMOS transistor 529.

Referring to the right side of FIG. 5, second switch 530-A includes a logic NAND gate 531, a first inverter (buffer) 541, an NMOS transistor 543, a second inverter (buffer) 545, a first triple-well NMOS transistor 547 and a second triple-well NMOS transistor 549 that are connected via an intermediate node 548. The input terminals of logic NAND gate 531 are respectively connected to wordline select signal WL[X]-SEL and to second control signal LVS-CNTL2. The remaining components are connected between VCC, the −2 V source, and common node 500 in a similar manner as that described above with reference to first switch 510-A.

Referring to the lower portion of FIG. 5, in addition to first switch 510-A and second switch 520-B, low voltage switch circuit 433-1 includes a third switch 550 for selectively pulling common node 500 to ground. Third switch 550 includes a first inverter 551 and a second inverter 553 having input terminals connected to first control signal LVS-CNTL1 and second control signal LVS-CNTL2, respectively, and output terminals connected to the gate terminals of NMOS pass transistors 555 and 557, which are connected in series between common node 500 and ground.

In operation, low voltage switch 433-1 selectively connects common node 500 to the −8 V supply, the −2 V supply, or ground in response to the logic state of the wordline select signal WL[X]-SEL and the control signals LVS-CNTL1 and LVS-CNTL2. When both control signals LVS-CNTL1 and LVS-CNTL2 are logic low, then inverters 551 and 553 of switch 550 generate high output signals that turn on NMOS pass transistors 555 and 557, thereby connecting common node 500 to ground. First switch 510-A is turned on to connect common node 500 to the −8 V source when the first control signal LVS-CNTL1 and the wordline select signal WL[X]-SEL are logic high (second control signal LVS-CNTL2 is logic low). Under these conditions, NAND gate 511 generates a logic low output signal that is inverted by first and second inverters 521 and 525, thereby causing these inverters to generate logic high output signals that turn on first and second triple-well NMOS transistors 527 and 529 to connect common node 500 to the −8 V source. Conversely, switch 530 is turned on to connect common node 500 to the −2 V source when the second control signal LVS-CNTL2 and the wordline select signal WL[X]-SEL are logic high (first control signal LVS-CNTL1 is logic low). Under these conditions, NAND gate 531 generates a logic low output signal that is inverted by first and second inverters 541 and 545, thereby causing these inverters to generate logic high output signals that turn on first and second triple-well NMOS transistors 547 and 549 to connect common node 500 to the −2 V source.

Figure 11:
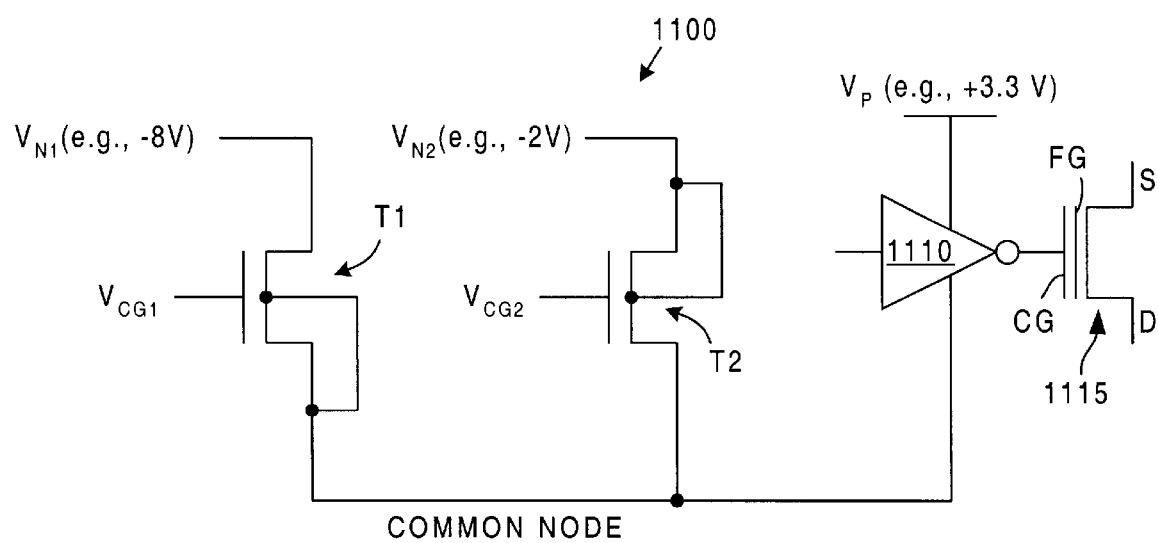
FIG. 11 is a schematic diagram of a conventional switching circuit for transferring multiple negative voltages to a common node.

Low voltage switch 433-1 avoids the problems associated with conventional switching circuit 1100 (see FIG. 11) by isolating the −2 V source from common node 500 using series connected triple-well NMOS transistors 547 and 549.

Specifically, because the negative supply rail of inverter 545 is connected to common node 500, both the drain and gate terminals of triple-well NMOS transistor 549 are maintained at −8 V when the −8 V source is connected to common node 500 (similarly, triple-well NMOS transistor 547 remains turned off due to the −2 V applied to its source and gate terminals). Accordingly, no current flows from the −2 V source to common node 500 while first switch 510-A is turned on, thereby providing a reliable −8 V program/erase voltage when needed. Similarly, when second switch 530-A is turned on to connect the −2 V source to common node 500, common node is isolated from the −8 V source using series connected triple-well NMOS transistors 527 and 529.

Although low voltage switch 433-1 is illustrated with logic NAND gates 511 and 531 and inverters 521, 525, 541, and 545, it is understood that these elements may be replaced by logic AND gates and non-inverting buffer circuits. Accordingly, in the appended claims, the term "buffer" is intended to include both the inverters shown in FIG. 5, and non-inverting buffers.

Figure 6:
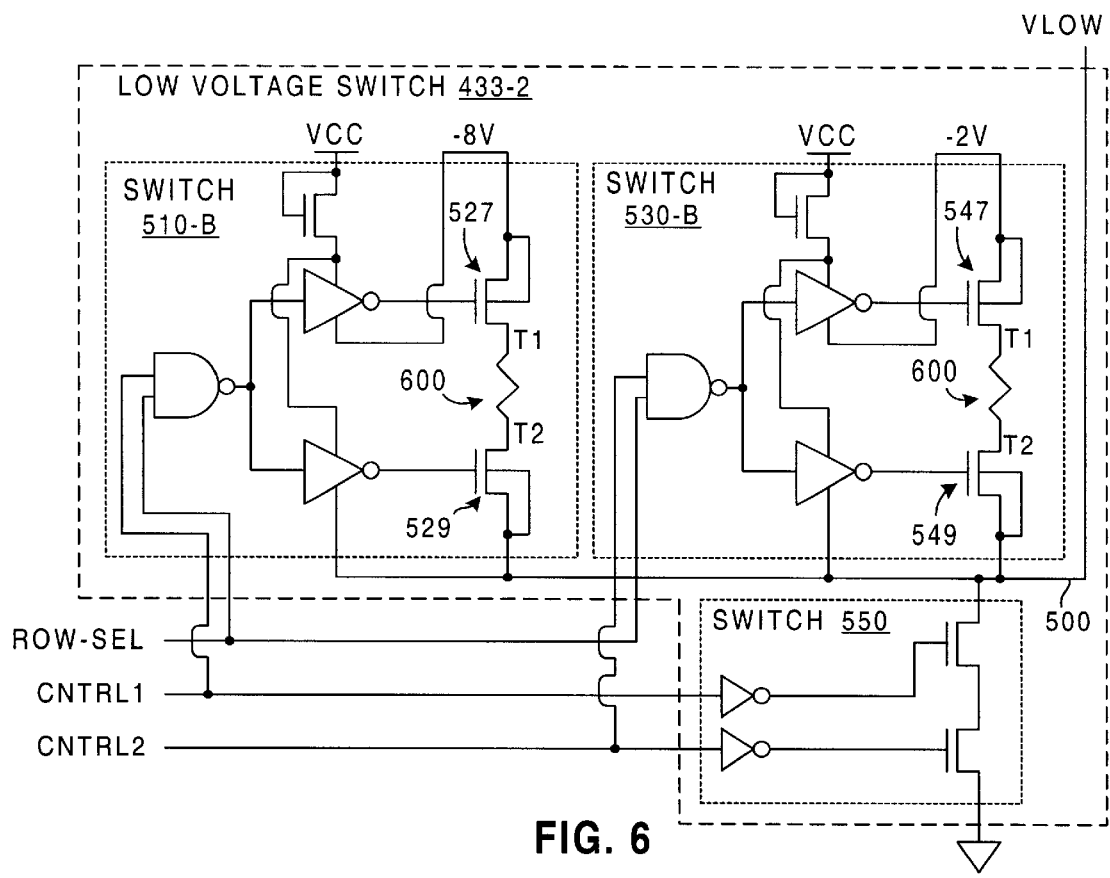
FIG. 6 is a schematic diagram showing a low voltage switch of the wordline switch circuit according to another embodiment of the present invention.

FIG. 6 is a schematic diagram showing a low voltage switch circuit 433-2 for transferring multiple negative voltages in accordance with a second embodiment of the present invention. Low voltage switch 433-2 is similar to low voltage switch 433-1 (discussed above with reference to FIG. 5), and represents another specific embodiment of low voltage switch 433 shown in FIG. 4. Low voltage switch 433-2 includes a first switch 510-B connected between the −8 V supply (i.e., charge pump 424; see FIG. 4), a common node 500, and a second switch 530-B connected between the −2 V supply (i.e., charge pump 426; see FIG. 4) and common node 500, and third switch 550 (discussed above). First switch 510-B differs from first switch 510-A (see FIG. 5) in that a triple P-well resistor 600 is connected between triple-well NMOS transistors 527 and 529 (i.e., in the location of intermediate node 528; see FIG. 5). Similarly, second switch 530-B differs from second switch 530-A (see FIG. 5) in that another triple P-well resistor 600 is connected between triple-well NMOS transistors 547 and 549. Other than the negative current resistance provided by triple P-well resistors 600, which are discussed below, the operation of low voltage switch 433-2 is identical to that of low voltage switch 433-1, discussed above.

A problem associated with the use of negative voltage sources to program floating gate memory cells arises when it becomes necessary to limit the flow of the currents generated by the negative voltages. Limiting these currents using conventional shallow N-well resistors is not technically possible because shallow N-well resistors will forward bias the P-substrate to the N-well junction, thereby creating substantial leakage. This problem is addressed by providing triple P-well resistors 600 that include a P-well resistor element formed within a deep N-well that is biased to VCC, which in turn is formed in a grounded P-substrate (or outer P-well. Biasing the deep N-well to VCC creates a reverse bias at the P-well to deep N-well junction, thereby preventing current leakage.

Figure 7:
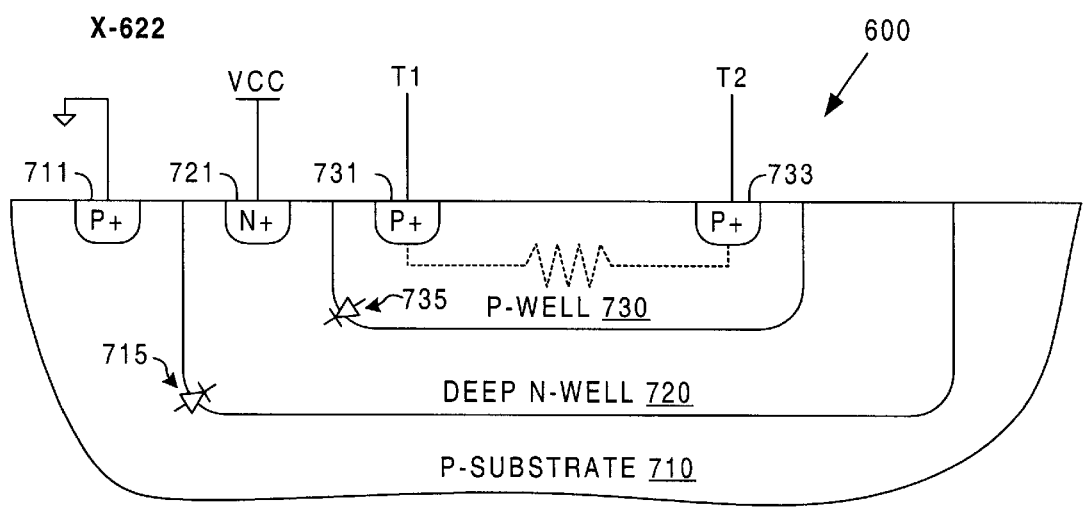
FIG. 7 is a cross-sectional side view showing a triple P-well resistor utilized in the embodiment shown in FIG. 6.

FIG. 7 is a cross-sectional side view showing an embodiment of triple P-well resistors 600, which is utilized in both first switch 510-B and second switch 530-B (see FIG. 6). Triple P-well resistor 600 is formed in a P-type substrate (or outer P-well) 710 that is coupled to ground through a P+ diffused region 711. In P-type substrate 710 is formed a deep N-well region 720 that is coupled to VCC through an N+ diffused region 721. Finally, a P-well region 730 is formed in deep N-well region 720, and includes a first P+ diffused region 731 forming a first terminal T1, and a second P+ diffused region 733 forming a second terminal T2. As indicated by the dashed resistor symbol, P-well region 730 effectively acts as a resistor extending between first terminal Ti and second terminal T2.

Triple P-well resistor 600 avoids the leakage problems associated with prior art resistor structures because deep N-well 720 is biased to VCC and P-substrate 710 grounded, thereby generating an effective diode 715 at the junction between P-substrate 710 and deep N-well region 720, and an effective diode 735 at the junction between deep N-well region 720 and P-well region 730. Effective diodes 715 and 35 serve to reverse bias the P-well-to-deep N-well junction by approximately 11 to 12 V (assuming VCC is 3.3 V, and the low doped junction breakdown voltage is more than 12 V). Accordingly, negative currents are passed through triple P-well resistor 600 with minimal leakage.

In another embodiment of the present invention (not shown), triple P-well resistors are selectively connected between terminals T1 and T2 using well-known mask-programmable or field programmable connections.

Figure 8:
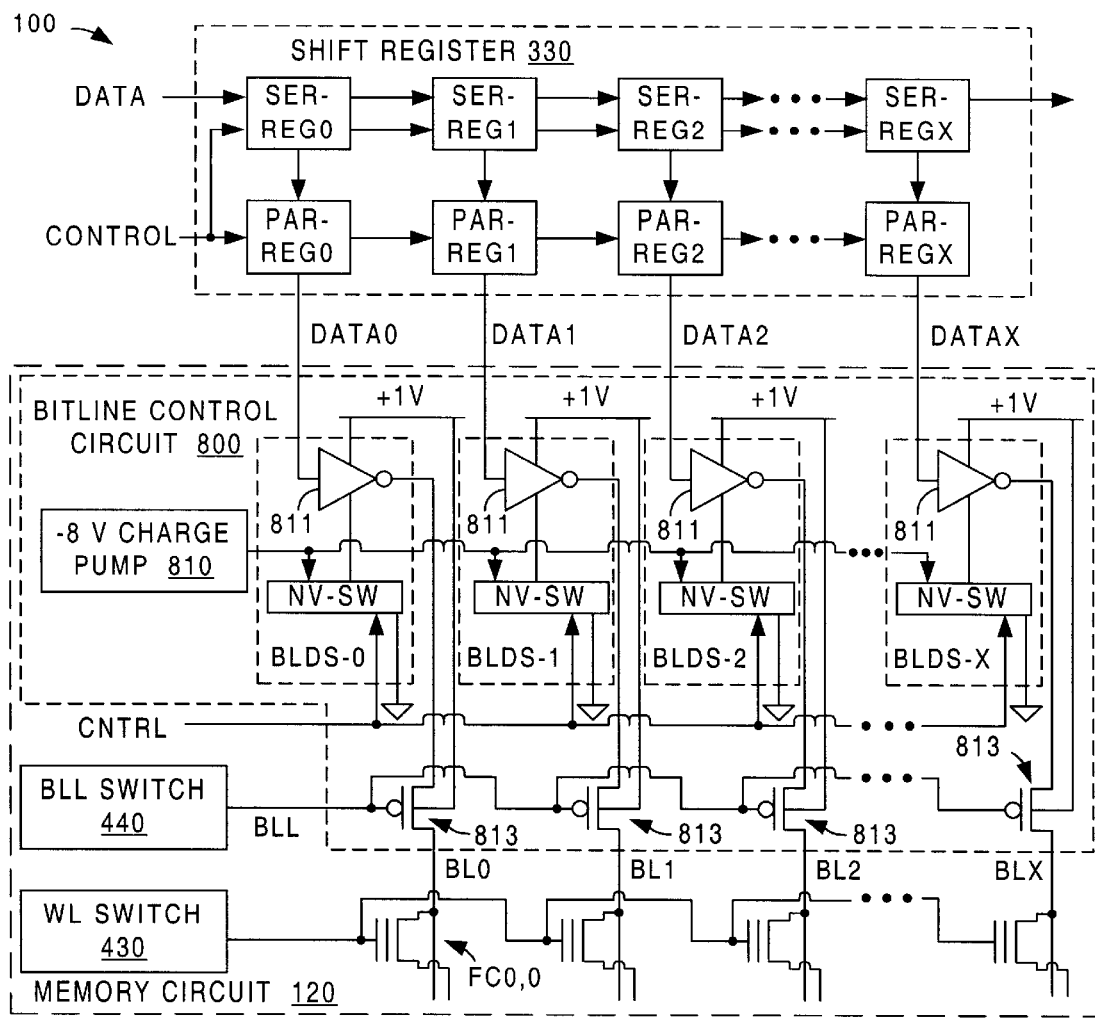
FIG. 8 is a diagram showing a portion of the memory circuit of FIG. 3 including a bitline latch (BLL) switch circuit.

FIG. 8 shows another portion of floating gate memory device 100 that includes a shift register 330 and a portion of memory circuit 120 that includes bitline control circuit 800. Bitline control circuit 800 is connected between shift register 330 and bitlines BL0 through BLX, which are connected to first terminals (e.g., the drains) of the floating gate memory cells (e.g., FC0,0) that are provided in memory circuit 120.

Shift register 330 forms part of JTAG circuit 300 (see FIG. 2), and its operation is described in additional detail in U.S. patent application Ser. No. 09/603,464, cited above. Briefly, data is shifted into serial registers SER-REG0 through SER-REGX under the control of JTAG circuit 300, and then shifted in parallel into parallel registers PAR-REG0 through PAR-REGX. The data is then applied from parallel registers PAR-REG0 through PAR-REGX to bitline control circuit 800 as data values DATA0 through DATAX.

Bitline control circuit 800 includes a charge pump circuit 810, bitline drain switches BLDS-0 through BLDS-X, and bitline latch transistors 813. Bitline drain switches BLDS-0 through BLDS-X receive corresponding data signals DATA0 through DATAX, and are connected to corresponding bitline latch transistors 813. Each bitline drain switch BLDS-0 through BLDS-X includes a bitline driver (inverter) 811 and a negative voltage switch NV-SW. Bitline drivers 811 receive data values DATA0 through DATAX from shift register 330, and generate output signals whose logic values are respectively applied to first terminal of bitline latch transistors 813. Note that the negative supply rail of each bitline driver 800 is connected to a corresponding negative voltage switch NV-SW, which passes either a −8 V potential or ground, depending upon the program/erase operation indicated by the operation control signal CNTRL received from JTAG circuit 300. The positive supply rail of each bitline driver 800 is connected to a +1 V source.

As discussed in the background section (above), in addition to selectively applying program/erase voltages of −8 V, +1 V, or ground (0 V) onto bitlines BL0 through BLX, it is often desirable to isolate (float) one terminal (i.e., the source or the drain) of a selected floating gate memory cell during a programming operation. Accordingly, bitline latch transistors 813 are provided to selectively disconnect bitlines BL0 through BLX during programming operations. To facilitate passage of both negative and positive voltages during non-programming operations, each bitline latch transistor 813 is provided as a PMOS transistor whose gate is controlled by BLL switch circuit 440, which generates bitline latch signal BLL. Typically, such a bitline latch signal is either a +5 V signal to turn off PMOS bitline latch transistors, or a 0 V signal that turns on PMOS bitline latch transistors to pass program/erase voltages. However, because the floating gate memory device of the present invention requires the passage of ground (0 V), this typical use of 0 V bitline latch signals creates a problem because bitline latch transistors 813 are unable to transmit the ground (0 V) signal to bitlines BL0 through BLX with a 0 V gate potential.

Figure 9:
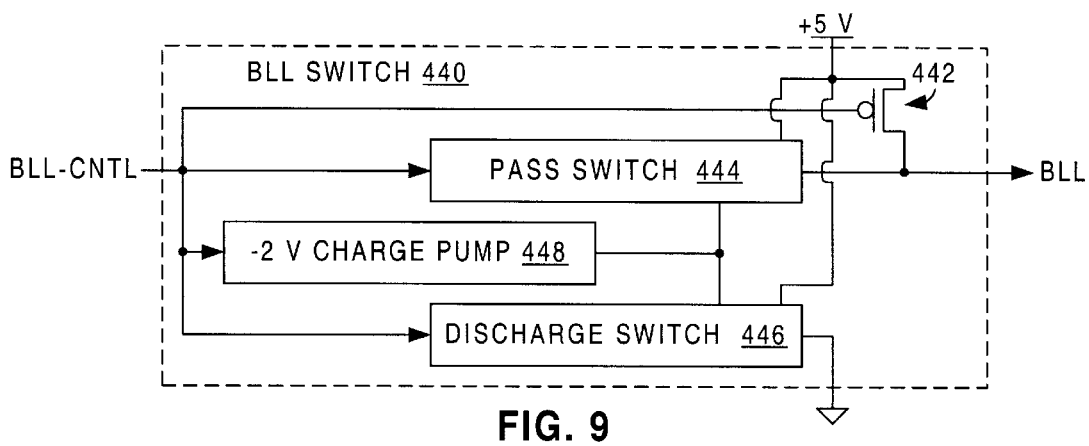
FIG. 9 is a block diagram showing a BLL switch circuit of FIG. 8 in additional detail.

FIG. 9 is a block diagram showing BLL switch circuit 440 that addresses the problem described above by selectively providing a −2 V bitline latch signal BLL during program operations to facilitate passage of 0 V signals. BLL switch 440 includes a PMOS transistor 442, a pass switch 444, a discharge circuit 446, and a −2 V charge pump 448. BLL switch circuit 440 receives a bitline latch control signal BLL-CNTL that has a logic high (e.g., VCC) voltage level during program operations, and a logic low (e.g., ground or 0 V) during all other operations. The control signal BLL-CNTL is applied to the gate of PMOS transistor 442, and to each of pass switch 444, discharge switch 446, and −2 V charge pump 448. During program operations, control signal BLL-CNTL is asserted (logic high) to activate −2 V charge pump 448, which supplies a −2 V potential to pass switch 444, which in turn transmits this −2 V potential to the gate terminals of bitline latch transistors 813 (see FIG. 8) as the bitline latch signal BLL. Conversely, in all other operating modes, the logic low control signal BLL-CNTL de-activates −2 V charge pump 448, turns on discharge switch 446 (thereby connecting the negative supply rail of pass switch 444 to ground), and turns on PMOS transistor 442 to apply the +5 V source to the gates of bitline latch transistors 813 (see FIG. 8) as the bitline latch signal BLL. Accordingly, BLL switch 440 conserves power by only activating −2 V charge pump 448 during program operations. Note that the negative supply rail of pass switch 444 is connected to ground via discharge switch 446 to assure proper operation of pass switch 444 during non-program operations.

Figure 10:
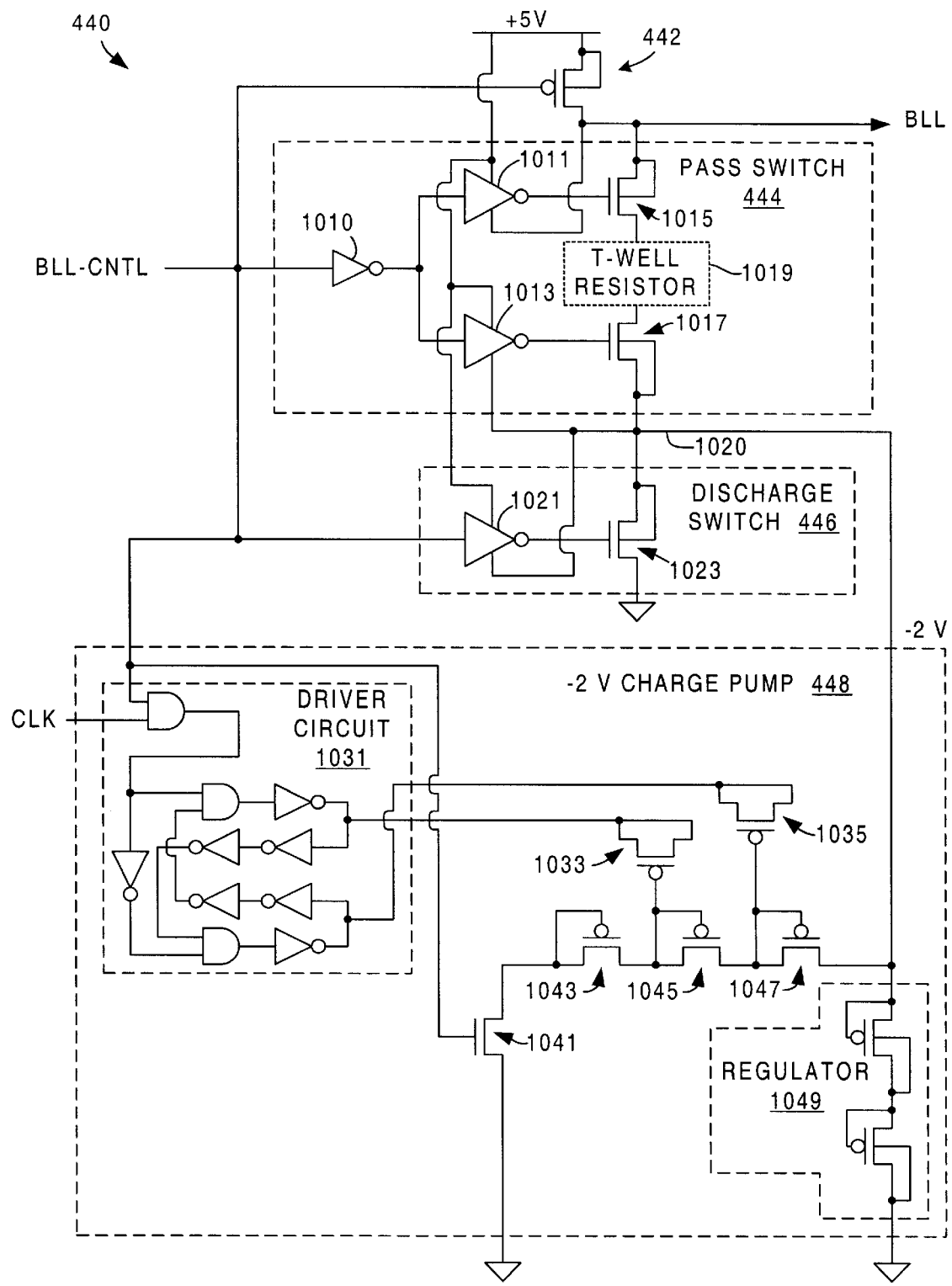
FIG. 10 is a schematic diagram showing the BLL switch circuit of FIG. 8 in even further detail.

FIG. 10 is a schematic diagram showing BLL switch circuit 440 in additional detail.

Referring to the upper portion of FIG. 10, PMOS transistor 442 is connected between a +5 V positive voltage source and the line carrying bitline latch signal BLL, and transmits the +5 V signal to this line when control signal BLL-CNTL is de-asserted (logic low). Located below PMOS transistor 442 is pass switch 444, which includes a first inverter 1010, a second inverter 1011, a third inverter 1013, a first triple-well NMOS transistor 1015, a second triple-well NMOS transistor 1017, and an optional triple P-well resistor 1019. The input terminal of first inverter 1010 is connected to receive control signal BLL-CNTL, and generates an inverted signal that is transmitted to the input terminals of second inverter 1011 and third inverter 1013. The positive supply rails of second inverter 1011 and third inverter 1013 are maintained at +5 V. The negative supply rail of second inverter 1011 is connected to the line that carries the bitline latch signal BLL. The output terminal of second inverter 1011 is connected to the gate terminal of first triple-well NMOS transistor 1015, which has a source/body connected to the line that carries the bitline latch signal BLL. The negative supply rail of third inverter 1013 is connected to a node 1020. The output terminal of third inverter 1013 is connected to the gate terminal of second triple-well NMOS transistor 1017, which has a drain/body connected to node 1020. Optional triple P-well (T-WELL) resistor 1019 is connected between the drain of first triple-well NMOS transistor 1015 and the source of second triple-well NMOS transistor 1017, and is identical to triple P-well resistor 600, which is shown in FIG. 7.

Discharge switch 446 includes an inverter 1021 and a triple-well NMOS transistor 1023. Inverter 1021 has an input terminal connected to receive the control signal BLL-CNTL, a positive supply rail connected to the +5 V source, a negative supply rail connected to node 1020, and an output terminal connected to the gate terminal of triple-well NMOS transistor 1023. Triple-well NMOS transistor 1023 has a source/body connected to node 1020, and a drain terminal connected to ground. Accordingly, discharge switch 446 connects node 1020 to ground via triple-well NMOS transistor 1023 when the control signal BLL-CNTL is de-asserted (i.e., logic low).

Referring to the lower portion of FIG. 10, −2 V charge pump 448 includes a driver circuit 1031 connected to the source and drain of a first PMOS transistor 1033 and to the source and drain of a second PMOS transistor 1035, an NMOS transistor 1041, third through fifth PMOS transistors 1043, 1045, and 1047, and a regulator 1049. Driver circuit 1031 receives the control signal BLL-CNTL and a clock signal CLK, and generates alternating driving signals using the illustrated logic structure that are transmitted to the source and drains of first and second PMOS transistors 1033 and 1035, respectively. NMOS transistor 1041 has a gate terminal connected to receive the control signal BLL-CNTL, and is connected between series-connected PMOS transistors 1043, 1045, and 1047 and ground.

BLL control circuit 440 operates as follows. As discussed above, bitline latch signal BLL is maintained at −2 V during programming operations by generating a logic high bitline latch control signal BLL-CNTL. In pass switch 444, asserted control signal BLL-CNTL causes first inverter 1010 to apply a logic low signal to the input terminals of second inverter 1011 and third inverter 1013, which in turn apply +5 V to the gate terminals of first and second triple-well NMOS transistors 1015 and 1017. Asserted control signal BLL-CNTL also causes inverter 1021 of discharge switch 446 to turn off triple-well NMOS transistor 1023, thereby isolating node 1020 from ground. Finally, asserted control signal BLL-CNTL is combined with the clock signal CLK to activate driver circuit 1031, and turns on NMOS transistor 1041 to connect the series-connected PMOS transistors 1043, 1045, and 1047 to ground. The resulting voltage oscillation through regulator 1049 and series-connected PMOS transistors 1043, 1045, and 1047 produces a −2 V potential at node 1020 that is passed by first triple-well NMOS transistor 1017, optional triple P-well resistor 1019, and second triple-well NMOS transistor 1015 to the gate terminals of bitline latch transistors 813 (see FIG. 8) as bitline latch signal BLL.

Conversely, if bitline latch control signal BLL-CNTL is held at a logic low value (e.g., during read or erase operations), then driver circuit 1031 remains off (−2 V charge pump 448 does not generate a −2 V potential), and discharge switch 446 turns on to connect node 1020 to ground. In pass switch 444, de-asserted control signal BLL-CNTL is inverted by first inverter 1010, and re-inverted by second and third inverters to turn off triple-well NMOS transistors 1015 and 1017. In addition, as the de-asserted control signal BLL-CNTL turns on PMOS transistor 442 to apply +5 V to the gate terminals of bitline latch transistors 813 (see FIG. 8) as bitline latch signal BLL.

Although the invention has been described in connection with the present embodiments, it is understood that this invention is not limited to the embodiment disclosed, but is capable of various modifications that would be apparent to a person skilled in the art. Thus, the invention is limited only by the following claims.

We claim:

1. A low voltage switch for selectively connecting a common node to one of a first negative voltage source and a second negative voltage source, the first negative voltage source having greater negative potential than the second negative voltage source, the low voltage switch comprising:
   a first triple-well transistor connected between the second negative voltage source and an intermediate node, the first triple-well transistor having a body tied to the second negative voltage source;
   a first buffer having an output terminal connected to a gate terminal of the first triple-well transistor, the first buffer having a supply rail connected to the second voltage source;
   a second triple-well transistor connected between the intermediate node and the common node, the second triple-well transistor having a body tied to the common node; and
   a second buffer having an output terminal connected to a gate terminal of the second triple-well transistor, the second buffer having a supply rail connected to the common node;
   wherein when the first negative voltage source is applied to the common node, the first buffer is biased to connect the second negative voltage source to the gate of the first triple-well transistor, and the second buffer is biased to connect the common node to the gate of the second triple-well transistor, thereby preventing current flow from the second negative voltage source to the common node.

2. The low voltage switch according to claim 1, further comprising a first logic gate having an output terminal connected to input terminals of the first and second buffers.

3. The low voltage switch according to claim 2, wherein the first and second triple-well transistors are NMOS transistors, wherein the first and second buffers are inverters, and wherein the logic gate is a logic NAND gate.

4. The low voltage switch according to claim 1, further comprising an NMOS transistor having a gate terminal and a source terminal connected between a positive voltage source and positive supply rails of the first and second buffers.

5. The low voltage switch according to claim 1, further comprising:
   a third triple-well transistor connected between the first negative voltage source and a second intermediate node, the first triple-well transistor having a body tied to the first negative voltage source;
   a third buffer having an output terminal connected to a gate terminal of the third triple-well transistor, the first buffer having a supply rail connected to the first negative voltage source;
   a fourth triple-well transistor connected between the second intermediate node and the common node, the fourth triple-well transistor having a body tied to the common node; and
   a fourth buffer having an output terminal connected to a gate terminal of the fourth triple-well transistor, the fourth buffer having a supply rail connected to the common node.

6. The low voltage switch according to claim 5, further comprising a second logic gate having an output terminal connected to input terminals of the third and fourth buffers.

7. The low voltage switch according to claim 6, wherein the third and fourth triple-well transistors are NMOS transistors, wherein the third and fourth buffers are inverters, and wherein the second logic gate is a logic NAND gate.

8. The low voltage switch according to claim 5, further comprising a second NMOS transistor having a gate terminal and a source terminal connected between a positive voltage source and positive supply rails of the third and fourth buffers.

9. The low voltage switch according to claim 5, further comprising a triple P-well resistor connected between a drain terminal of the third triple-well transistor and a source terminal of the fourth triple-well transistor.

10. The low voltage switch according to claim 9, wherein the triple P-well resistor comprises:
    a deep N-well region formed in a P-substrate, the deep N-well region being connected to a positive system voltage; and
    a P-well region formed in the deep N-well region and having a first P+ diffusion region connected to the drain terminal of the first triple-well transistor, and a second P+ diffusion region connected to the drain terminal of the second triple-well transistor.

11. A low voltage switch for selectively connecting a common node to one of a first negative voltage source and a second negative voltage source, the first negative voltage source having greater negative potential than the second negative voltage source, the low voltage switch comprising:
    a first triple-well transistor connected between the second negative voltage source and a first intermediate node, the first triple-well transistor having a body tied to the second negative voltage source;
    means for selectively applying the second negative voltage source to a gate terminal of the first triple-well transistor when the first negative voltage source is applied to the common node;
    a second triple-well transistor connected between the first intermediate node and the common node, the second triple-well transistor having a body tied to the common node; and
    means for selectively connecting the common node to a gate terminal of the second triple-well transistor when the first voltage source is applied to the common node.

12. The low voltage switch according to claim 11, further comprising:
    a third triple-well transistor connected between the first voltage source and a second intermediate node, the third triple-well transistor having a body tied to the second voltage source;
    means for selectively applying the first voltage source to a gate terminal of the third triple-well transistor when the second voltage source is applied to the common node;
    a fourth triple-well transistor connected between the sec- ond intermediate node and the common node, the fourth triple-well transistor having a body tied to the common node; and
    means for selectively connecting the common node to a gate terminal of the fourth triple-well transistor when the second voltage source is applied to the common node.

13. The low voltage switch according to claim 12, further comprising a triple P-well resistor connected between a drain terminal of the third triple-well transistor and a source terminal of the fourth triple-well transistor, wherein the triple P-well resistor comprises:

a deep N-well region formed in a P-substrate, the deep N-well region being connected to a positive system voltage; and a P-well region formed in the deep N-well region and having a first P+ diffusion region connected to the drain terminal of the first triple-well transistor, and a second P+ diffusion region connected to the drain terminal of the second triple-well transistor.

14. A floating gate memory device including a control circuit for transmitting control signals and address signals to a memory circuit, the memory circuit including a plurality of memory cells arranged in rows, each row of memory cells being connected to a wordline, the memory circuit also including a wordline control circuit including a plurality of wordline switches, wherein each wordline switch includes:

a wordline driver for selectively generating one of a first negative voltage and a second negative voltage on an associated wordline in accordance with the control signals received from the control circuit; and a low voltage switch connected between a negative supply rail of the wordline driver and both a first negative voltage source maintained at the first negative voltage and a second negative voltage source maintained at the second negative voltage, wherein the low voltage switch comprises:

a first triple-well transistor connected between the second negative voltage source and a first intermediate node, the first triple-well transistor having a body tied to the second negative voltage source;

a first buffer having an output terminal connected to a gate terminal of the first triple-well transistor, the first buffer having a supply rail connected to the second negative voltage source;

a second triple-well transistor connected between the first intermediate node and the negative supply rail of the wordline driver, the second triple-well transistor having a body tied to the negative supply rail of the wordline driver; and a second buffer having an output terminal connected to a gate terminal of the second triple-well transistor, the second buffer having a supply rail connected to the negative supply rail of the wordline driver.

15. The floating gate memory device according to claim 14, wherein the low voltage switch further comprises: a third triple-well transistor connected between the first negative voltage source and a second intermediate node, the first triple-well transistor having a body tied to the first negative voltage source;

a third buffer having an output terminal connected to a gate terminal of the third triple-well transistor, the first buffer having a supply rail connected to the first negative voltage source;

a fourth triple-well transistor connected between the second intermediate node and the negative supply rail of the wordline driver, the fourth triple-well transistor having a body tied to the negative supply rail of the wordline driver; and a fourth buffer having an output terminal connected to a gate terminal of the fourth triple-well transistor, the fourth buffer having a supply rail connected to the negative supply rail of the wordline driver.

16. The floating gate memory device according to claim 14, wherein the low voltage switch further includes a triple P-well resistor connected between a drain terminal of the third triple-well transistor and a source terminal of the fourth triple-well transistor, wherein the triple P-well resistor comprises:

a deep N-well region formed in a P-substrate, the deep N-well region being connected to a positive system voltage; and a P-well region formed in the deep N-well region and having a first P+ diffusion region connected to the drain terminal of the first triple-well transistor, and a second P+ diffusion region connected to the drain terminal of the second triple-well transistor.

\* \* \* \* \*